United States Patent [19]

George et al.

[11] Patent Number: 5,332,444
[45] Date of Patent: Jul. 26, 1994

[54] GAS PHASE CLEANING AGENTS FOR REMOVING METAL CONTAINING CONTAMINANTS FROM INTEGRATED CIRCUIT ASSEMBLIES AND A PROCESS FOR USING THE SAME

[75] Inventors: Mark A. George, Allentown; David A. Bohling, Emmaus, both of Pa.

[73] Assignee: Air Products and Chemicals, Inc., Allentown, Pa.

[21] Appl. No.: 982,196

[22] Filed: Nov. 25, 1992

[51] Int. Cl.$^5$ .................... H01L 21/306; B08B 5/00; C09K 13/00
[52] U.S. Cl. ........................... 134/1; 134/2; 252/79.1; 252/181.1; 252/372; 156/643; 156/646; 437/946
[58] Field of Search ............... 134/2, 3, 1; 437/946; 156/646, 643; 252/79.1, 181.1, 372

[56] References Cited

U.S. PATENT DOCUMENTS 4,592,926  6/1986  Rubin et al. .................... 427/82
5,094,701  3/1992  Norman et al. ................. 148/23

OTHER PUBLICATIONS

T. Ito and coworkers, Proc. 2nd Int'l. Symp. on Cleaning Technol. In Semicond. Dev. Manuf., 92-12, pp. 72-76, (1992).

Primary Examiner—Robert Kunemund
Assistant Examiner—Ourmazd S. Ojan
Attorney, Agent, or Firm—Keith D. Gourley; James C. Simmons; William F. Marsh

[57] ABSTRACT

This invention is a vapor-phase process for cleaning metal-containing contaminants from the surfaces of integrated circuits and semiconductors between the numerous fabricating steps required to manufacture the finished electronic devices. The process employs cleaning agents comprising an effective amount of hexamethyldisilazane. The process comprises contacting the surface to be cleaned with an effective amount of the desired cleaning agent at a temperature sufficient to form volatile metal-ligand complexes on the surface of the substrate to be cleaned. The volatile metal-ligand complexes are sublimed from the surfaces of the substrate providing a clean, substantially residue-free surface.

22 Claims, No Drawings

GAS PHASE CLEANING AGENTS FOR REMOVING METAL CONTAINING CONTAMINANTS FROM INTEGRATED CIRCUIT ASSEMBLIES AND A PROCESS FOR USING THE SAME

TECHNICAL FIELD

The present invention relates to cleaning agents used in fabricating semiconductors and integrated circuits and a substantially residue-free vapor-phase process for using the cleaning agents which comprise an effective amount of hexamethyldisilazane.

BACKGROUND OF THE INVENTION

The electronics industry is striving to further miniaturize semiconductors and integrated circuits while increasing design complexity. To accomplish that result, the individual, active electrical devices such as transistors, diodes and the like used to create the circuitry and the interconnects between such devices must be fabricated on an increasingly small scale. As circuitry dimensions decrease, contaminants present during the fabrication of electronic devices cause significantly more device failures and malfunctions. Therefore, surface contaminants must be carefully removed from the circuit assembly to maintain quality standards and to maximize the yield of fully functioning integrated circuits.

Contaminants present during integrated circuit fabrication include photoresist materials, residual organic and metallic contaminants such as alkali metals and native/metallic oxides. Metallic films comprising metal oxides and metal halides can also be inadvertently deposited onto electronic devices during immersion into etchant or resist stripper baths, both which may contain metal ions and free metals in solution. Likewise, corrosive chlorides are deposited onto such assemblies through various handling operations and plasma etching processes. These contaminants can weaken or embrittle the electrical connectors of the device and can cause the layers of the device to delaminate resulting in current leakages or physical failure. Sodium-containing contaminants are particularly problematic because sodium can readily diffuse into the silicon matrix causing device failure.

Chemical cleaning agents are typically used to remove bonded or adsorbed metallic oxides and corrosive chloride residues from water surfaces between the numerous individual steps required to fabricate an integrated circuit. Conventional chemical cleaning processes are typically performed using a series of acid and rinse baths. These cleaning processes are often characterized as "wet" techniques because the electronic device is immersed in a liquid cleaning solution immediately prior to performing the next processing step. Numerous problems are encountered when using liquid cleaning solutions including incomplete removal of the cleaning agent from the surface and new contaminants being introduced onto the surface to be cleaned. Hazardous liquid wastes generated during the process must also be disposed.

A typical wet cleaning process for removing film contaminants from a bare silicon or thermally grown silicon oxide crystal comprises immersing the wafer into an inorganic stripper such as sulfuric acid/hydrogen peroxide followed by immersing in a sulfuric acid/oxidant mixture and rinsing with deionized water; immersing the wafer into a mixture of water/ammonium hydroxide/hydrogen peroxide to remove metal oxides and metals followed by rinsing with deionized water; immersing the still wet wafers into a mixture of water/hydrochloric acid/hydrogen peroxide to desorb atomic and ionic contaminants; and rinsing the cleaned wafers with distilled water and drying the same in a inert atmosphere such as nitrogen.

Numerous problems are associated with conventional "wet" cleaning processes. For example, ammonia and HCl vapors can mix to form particulate smoke containing colloidal ammonium chloride particles which can contaminate the wafer. Special care must also be taken to prevent hydrogen peroxide from being depleted from the cleaning solution because ammonium hydroxide in the absence of hydrogen peroxide acts as a silicon etchant. Additional contaminants may also be introduced into the system during the numerous distilled water rinsing steps required to remove cleaning residue. Finally, trace moisture must be removed, typically via high temperature vacuum applications, before conducting the next processing step.

Disadvantages associated with wet wafer cleaning processes have led to a search for "dry" cleaning processes wherein the cleaning agent is applied and removed in the vapor state. In order to conduct a vapor phase cleaning process, the products formed by contacting the cleaning agent and the contaminants must possess sufficient volatility to enable essentially complete removal from the surface to be cleaned. Manufacturers are continually searching for "dry" cleaning agents and vapor-phase processes for using such cleaning agents which eliminate the enumerated problems wherein high quality electronic devices can be fabricated without using environmentally harmful reagents.

T. Ito and coworkers, Proc. 2nd Int'l Symp. on Cleaning Technol. In Semicond. Dev. Manuf., 92–12 72 [1992] disclose a process for cleaning iron and aluminum contaminants from a silicon surface wherein photoexcited chlorine radicals are employed. Both iron and aluminum on the silicon surface are completely removed by UV-excited dry cleaning at a cleaning temperature of 170° C. Iron and aluminum concentrations on the silicon surface were decreased two orders of magnitude when the surface was etched only 2 nm deep. Ito and coworkers have also reported that the photoexcited chlorine radicals decrease the amount of sodium residing on the substrate's surface. Applicants believe that the sodium chloride formed during the process can diffuse into the bulk of the substrate causing deleterious electrical effects.

Many of these disadvantages have been overcome by U.S. Pat. No. 5,094,701, assigned to Air Products and Chemicals, Inc., which discloses a residue-free cleaning process for removing metal-containing comtaminants from a surface of a substrate of the type used in manufacturing semiconductor devices. The process comprises contacting the substrate with an effective amount of a beta-diketone or beta-ketoimine dispersed in an atmosphere capable of oxidizing the metal-containing contaminants at a temperature sufficient to form volatile metal-ligand complexes on the surface of the substrate. The volatile metal-ligand complexes are sublimed from the surface of the substrate leaving essentially no residue. The process is particularly effective in removing copper-, iron- and silver-containing contaminants from substrates of the type used in the electronics industry.

The electronics industry is seeking an improved process for removing metal-containing contaminants, and particularly alkali-metal containing contaminants such as the oxides, hydroxides and salts of sodium, from the surface of substrates such as silicon which are commonly used in fabricating electronic devices.

BRIEF SUMMARY OF THE INVENTION

The present invention is a vapor-phase process for cleaning metal-containing contaminants, particularly, alkali metal-containing contaminants from the surfaces of substrates wuch as those used in integrated circuits and semiconductors, between the numerous individual fabricating steps required to form the finished electronic device. The process comprises contacting the metal-containing contaminants residing on the surface of the substrate with an effective amount of a cleaning agent comprising hexamethyldisilazane in the vapor phase at a temperature sufficient to form a volatile metal-ligand complex; and subliming the volatile metal-ligand complex from the surface of the substrate to provide a cleaned surface of the substrate.

The vapor phase cleaning agent according to the present invention, which comprises an effective amount of hexamethyldisilazane, can be delivered into any conventional reactor via its vapor pressure or can be dispersed in a reducing atmosphere such as hydrogen, ammonia or silane or in an inert atmosphere such as nitrogen, argon or helium.

Metal-containing contaminants capable of being cleaned from the enumerated substrates include any composition which is capable of reacting with the hexamethyldisilazane to form a volatile metal-ligand complex. Representative metal-containing contaminants include oxides, hydroxides and salts of metals, preferably alkali metals, and most preferably, lithium, sodium and potassium. Metal-containing contaminants can be removed from the surface of a broad range of substrates including silicon, silicon oxide, borophosphosilicate glass and phosphosilicate glass. The process can be utilized to clean metal-containing contaminants from the surface of a substrate formed of any material which does not react adversely with the vapor phase reagents under the enumerated process conditions.

Applicants have discovered that certain metal-containing contaminants are not sufficiently reactive with hexamethyldisilazane to form the desired volatile metal-ligand complex. Consequently, the instant process includes an optional step wherein the metal-containing contaminants residing on the surface of the substrate to be cleaned are contacted with an activating reagent under conditions sufficient to form an activated metal-containing compound which is then capable or reacting with hexamethyldisilazane to form the desired volatile metal-ligand complex.

The invention offers numerous advantages over conventional wet-cleaning methods because the instant cleaning process can be conducted in-situ, meaning that the electronic device under fabrication does not have to be removed from the fabrication apparatus in order to clean metal-containing contaminants from the surfaces of the electronic device prior to conducting the next fabricating step. Moreover, the cleaning agents leave essentially no residue on the surface of the electronic assembly which might interfere with subsequent manufacturing steps or assembly performance.

DETAILED DESCRIPTION OF THE INVENTION

The present invention relates to a cleaning process for removing metal-containing contaminants from the surfaces of electronic devices such as semiconductors and integrated circuits between the numerous individual fabricating steps required to manufacture the electronic device. The process utilizes a new vapor phase cleaning agent which comprises an effective amount of hexamethyldisilazane (HMDS).

According to the general embodiment of the invention, Applicants' process comprises contacting the surface of the substrate to be cleaned of metal-containing contaminants with an effective amount of a cleaning agent comprising HMDS in the vapor phase at a temperature sufficient to form a volatile metal-ligand complex and subliming the volatile metal-ligand complex from the surface of the substrate to provide a cleaned surface of the substrate. This embodiment can be conveniently employed when the metal-containing contaminants are sufficiently reactive with HMDS under the enumerated reaction conditions to form a volatile metal-ligand complex.

Typical temperatures for practicing the process range from about 150° to about 215° C. The optimum reaction time and temperature for practicing the process will vary depending upon the type and quantity of metal-containing contaminant to be cleaned and the like. Typical processing time ranges from about 5 to 50 minutes depending upon contaminant loading on the surface of the substrate.

Optionally, formation of the volatile metal-ligand complexes of the general embodiment can be conveniently promoted by contacting the substrate and HMDS in the presence of energy generated by an energy source including but not limited to ions generated by an ion gun, an RF plasma generator, a microwave plasma generator, a D.C. discharge generator and a heated tungsten filament. The energy source is configured to deliver a flux and wavelength sufficient to cause the metal-containing contaminants to disassociate or ionize thereby promoting the formation of the desired volatile metal-ligand complex. Suitable energy sources as well as the optimum flux and wavelength can be readily determined by one of ordinary skill in the art.

Applicants have discovered that some metal-containing contaminants, particularly alkali-metal containing contaminants such as oxides, hydroxides or salts of alkali metals such are lithium, sodium or potassium, are not necessarily sufficiently reactive with HMDS under the enumerated reaction conditions to form a volatile metal-ligand complex which can readily be sublimed from the surface of the Therefore, an optional step is employed wherein the surface of the substrate to be cleaned is contacted with an activating reagent under conditions sufficient to form an activated metal-containing compound which is capable of reacting with HMDS under the enumerated process conditions.

The optional step of forming an activated metal-containing compound involves converting the metal-containing contaminants to compounds which more readily react with the cleaning agent, HMDS, to form volatile metal-ligand complexes. Therefore, such compounds are referred to as "activated metal-containing compounds". The activated metal-containing compounds can be formed by any of the following procedures as well as those variants which will be apparent to those of ordinary skill in the art upon reading this Specification.

In order to form the activated metal-containing compound, the metal-containing contaminant must be subjected to an activating reagent capable of converting the metal-containing compound to the activated metal-containing compound. This conversion is desirably carried out in-situ, meaning that the substrate to be cleaned does not have to be removed from the processing apparatus in order to conduct this step. Applicants have discovered that suitable activating reagents including an ion source generated from conventional, commercially available ion guns wherein the metal-containing contaminant absorbs energy from the ion source and is converted to a compound which can readily react with HMDS. Those of ordinary skill in the art can readily select an ion gun having the desired flux and energy (wavelength) to excite the metal-containing compound into an activated metal-containing compound. Such activated metal-containing compounds may reside in any form including ionic species and radicals as well as plasmas.

Alternatively, the activated metal-containing compound can be formed by contacting the metal-containing contaminants with a gas, including but not limited to hydrogen or ammonia, which has been subjected to an energy source capable of converting the hydrogen or ammonia into an excited state. The term, excited state, refers to radicals, ions, plasma or other species formed when the gas absorbs energy generated from the energy source. Suitable energy sources for converting hydrogen gas into its excited state include RF plasma, microwave plasma, D.C. discharge, a tungsten filament and deep UV, typically below 200 nm. Ammonia gas can be converted into its excited state by the above-mentioned energy sources except that a tungsten filament source is not recommended.

This embodiment can be performed in a single step wherein the substrate and gas are subjected to the energy source or in two steps wherein the gas is first subjected to the desired energy source to form the corresponding gas in its excited state, and then contacting the substrate with the gas in its excited state. By way of example, sodium-containing contaminants on the surface of the substrate typically exist as an oxide or hydroxide as determined by X-Ray Photoelectron Spectroscopy (XPS). Therefore, the first step of this process is to convert the sodium-containing contaminants to the activated metal-containing compound.

Applicants have formed the activated metal-containing compound by generating a plasma of hydrogen and ammonia and flooding the surface to be cleaned with the plasma, although other excitation or ionization sources would also be effective. The plasma is highly reactive with the sodium-containing contaminants resulting in formation of an activated metal-containing compound, for example, $NaNH_2$. The converted surface is then exposed in-situ to HMDS ($NH(Si(CH_3)_3)_2$) within the desired temperature range. The HMDS reacts with the activated metal-containing compound to produce the hexamethyldisilamide coordinated compound, for example $Na[N(Si(CH_3)_3)_2]$ (NaTMSN), which is volatile, and ammonia ($NH_3$).

The process according to the present invention employs a new class of cleaning agents comprising an effective amount of hexamethyldisilazane which can be prepared according to methods well known in the art and is commercially available from Shumacher Company, Carlsbad, Calif., and Sigma Chemical Company (Product Number H 4875). The commercially available material is preferably purified using conventional techniques to remove any unwanted contaminants. The term, effective amount, as applied to the cleaning agents of this invention, refers to that amount of HMDS required to obtain the desired cleaning activity. For example, an effective amount of HMDS can be generated at temperatures as low as 35° C. wherein a pressure of greater than 1 torr is produced.

The effective amount of cleaning agent required to practice the claimed process is easily determined by those familiar with the art and will depend upon the manner in which the cleaning agent is delivered into the fabricating apparatus. Suitable vapor pressures are generated by HMDS at temperatures between about room temperature and about 220° C. which upper limit represents the decomposition temperature of HMDS. The operating pressure is not critical to the practice of this invention.

In an alternate embodiment, an effective amount of the cleaning agent is dispersed in an inert atmosphere. Suitable inert atmospheres include nitrogen, argon and helium. The effective amount of cleaning agent will vary depending upon the metal-containing contaminants to be cleaned from the surface and the surface loading of the contaminants. Typical gas phase concentrations range from 1.0% to about 100.0%, and preferably, from 5.0% to 25.0% of the HMDS dispersed in the desired atmosphere. In another embodiment, an effective amount of the cleaning agent is dispersed in a reducing atmosphere such as hydrogen, ammonia or silane. Typical gas phase ligand concentrations range from 1.0% to about 100.0%, and preferably, from 5.0% to 25.0% of the desired ligand dispersed in the reducing atmosphere.

The term, metal-ligand complex, refers to the reaction product of the metal-containing contaminant or the activated metal containing compound and HMDS. The volatile metal-ligand complexes residing on the surfaces of the electronic device or substrate are then sublimed from the surface providing a clean, substantially residue-free surface. The process substantially reduces the amount of metal-containing contaminants residing on the substrate's surfaces which can interfere with the depositing of conducting metals, etching steps and masking operations required to manufacture electronic devices.

The cleaning agents according to the present invention can be applied by both machine and manual operations known in the art. The appropriate method for delivering HMDS to the substrates to be cleaned will depend upon factors such as the properties of the electronic device, the type of metal-containing contaminants to be removed from the substrate's surface and the like.

Applicants' process is capable of removing metal-containing contaminants from a broad range of substrates used in manufacturing electronic devices such as integrated circuits and semiconductors. Any substrate having metal-containing contaminants wherein the substrate is not adversely affected by HMDS under the specified process operating conditions can be used in the present process. Representative substrates include, but are not limited to silicon, silicon oxide, borophosphosilicate glass and phosphosilicate glass.

The instant cleaning process utilizing the cleaning agents disclosed herein can be used to remove numerous metal-containing contaminants. For purposes of interpreting the Claims, the invention contemplates any metal-containing contaminant which is capable of reacting with the cleaning agents or activating reagents of the present invention to form volatile metal-ligand complexes. Representative metal-containing contaminants include metal oxides represented by the formula MO, $MO_2$, $MO_3$, $M_2O$ and $M_2O_3$ wherein M represents the metal of the respective metal oxide. M may represent a broad range of metals including the alkali metals. The process is also capable of cleaning metal-containing contaminants such as metal oxides, metal hydroxides and metal salts represented by the formula $M^{+n}(X^-)_n$ wherein n is 1, 2 or 3; X is an anion such as a sulfate and M represents the metal of the respective metal salt. Again, M represents a broad range of metals including lithium, sodium and potassium.

While the instant process is particularly suited toward cleaning metal-containing contaminants residing on the surfaces of substrates such as those used to fabricate electronic devices, the process can also be employed to selectively clean one metallic film while maintaining the integrity of another metallic film residing on the substrate's surface. The selective process can be employed whenever two or more discrete metal-containing contaminants such as metal oxide films or metal halide films are present on the surface of a device wherein the reaction of the cleaning agent with a particular metal-containing contaminant occurs more rapidly than with the other contaminant residing of the substrate's surface.

In order to more fully describe the practice of the present process, a general embodiment of the cleaning process will now be presented. The substrate to be cleaned is placed in a heated chamber, such as a chemical vapor deposition chamber, commercial chemical vapor deposition furnace tube or commercial cleaning tool used in elevated temperature processes. The substrate can also be left in the original process chamber, such as a plasma etching reactor, provided that the chamber can be brought to the appropriate cleaning process temperature.

An initial test may be conducted to determine whether the metal-containing contaminants are sufficiently reactive at the operating temperatures to react with HMDS. If the metal-containing contaminants are not sufficiently reactive, the first step of the process comprises forming the activated metal-containing compound as previously discussed. The substrate is then heated to the desired temperature, typically from about 150° to 215° C., the desired cleaning agent is delivered to the substrate to be cleaned by heating the HMDS to a temperature sufficient to create a sufficient operating vapor pressure. Alternately, HMDS may be dispersed in the desired reducing atmosphere or inert atmosphere and passed into the hot zone of the selected apparatus by conventional techniques. HMDS may be continuously or intermittently delivered into the reactor or cleaning chamber.

Metals in the zero oxidation state residing on the surface of the substrate may optionally be oxidized by reacting the metal with an oxidizing atmosphere at elevated temperatures to produce the corresponding metal oxides which then react with the cleaning agents disclosed herein to form volatile metal-ligand complexes which can be conveniently sublimed from the surfaces of the device to produce a cleaned surface. The sublimation temperature is not critical to practicing the present invention so long as the temperature is not so high that the volatile metal-ligand complex is caused to decompose. The sublimation temperature is chosen to achieve the desired sublimation rate. Typical sublimation temperatures range from room temperature to just below the decomposition temperatures of the volatile metal-ligand complexes. The sublimation can be performed under vacuum which substantially reduces the temperature required to reach the desired sublimation rate.

The cleaning pattern can be conveniently controlled by masking operations known in the art wherein portions of the substrate's surface which are not to be cleaned are covered with a material which will not react with the cleaning agent.

The following example is provided to further illustrate the present invention and is not intended to restrict the scope of the invention. In the following example, temperatures are set forth uncorrected in degrees Celsius. Samples were analyzed in a UHV surface science analytical tool equipped with X-Ray Photoelectron and Auger Electron Spectroscopy which were used to quantitatively analyze surface metal concentrations. Samples were analyzed before and after practicing the cleaning process.

EXAMPLE

CLEANING OF ALKALI METAL-CONTAINING CONTAMINANTS FROM A SILICON SURFACE USING A CLEANING AGENT COMPRISING HEXAMETHYLDISILAZANE

Bare <100> silcon wafers (1.5 cm²) were cleaned using a standard RCA cleaning sequence. The wafers were then contaminated by doping sodium hydroxide (NaOH) onto the wafers in the following manner. NaOH was dissolved in deionized water to a concentration of $1.305 \times 10^{-7}$ moles/cc. An aliquot of 0.1 cc of this solution was dropped onto the wafer and allowed to evaporate at 50° C. leaving NaOH on the surface of the wafer as confirmed by scanning electron microscopy. The doped wafers were introduced into the processing reactor with further modification.

A microwave cavity was positioned parallel to the wafer surface within the reactor. A mixture of $H_2$ (5% in nitrogen gas) was flowed through a 13 mm I.D. quartz tube within the microwave cavity. A plasma was initiated in the cavity by irradiating the cavity with an RF power at 2.450 MHz and initiating the plasma by using a spark from a high frequency coil (Tesla coil). The microwave cavity was tuned by a triple stub tuning network which optimized the forward and reflected power levels. The flow rate of hydrogen gas to the reactor was 80 sccm and the pressure was 250 millitorr. Ammonia was introduced at 20 sccm into the reactor from an alternate gas inlet port. The surface temperature of the wafer was maintained between 165° C. and 175° C. HMDS was introduced into the chamber at a flow rate of 5 sccm with a balance of argon at 30 sccm with the chamber pressure being maintained at 1 torr, the lowest calibration pressure on the mass flow controller. The results of the example are presented in the Table.

TABLE

CLEANING OF ALKALI METAL-CONTAINING CONTAMINANTS FROM A SILICON SURFACE USING A CLEANING AGENT COMPRISING HEXAMETHYLDISILAZANE

| RUN | Na LEVEL AFTER DOPING AND CARBON REMOVAL (ATOM PERCENT) | Na LEVEL AFTER CLEANING CYCLE (ATOM PERCENT) |
|---|---|---|
| 1 | 9.0 | 2.1 |
| 2 | 8.4 | 1.7 |
| 3 | 11.0 | 1.9 |

The Table demonstrates that the present process effectively removes sodium-containing contaminants from the surface of a silicon wafer. Runs 1 through 3 show that the process is highly reproducible. The amount of carbon residing on the substrate's surface, before and after conducting the process, remained unchanged at about 20 atom percent which proves that neither the HMDS or the volatile metaligand complex decomposed during the process.

The present vapor-phase cleaning process for removing metal-containing contaminants from the surfaces of electronic devices during their fabrication offers numerous advantages over typical wet cleaning methods known in the art. The instant cleaning process can be conducted in the vapor-phase thereby eliminating the necessity for exposing the substrate to the clean room environment during apparatus transfer. Recontamination via exposure to other contaminants is thereby avoided. Moreover, the cleaning agents leave essentially no residue on the surface of the electronic assembly which might later interfere with subsequent manufacturing steps and device performance. This invention also solves problems encountered during the manufacture of VLSI and ULSI circuits wherein contaminants of metals, particularly, alkali metals such as sodium are left on critical surfaces.

Having thus described the present invention, what is now deemed appropriate for Letters Patent is set out in the following appended claims.

We claim:

1. A cleaning agent for removing metal-containing contaminants from a surface of a substrate, the cleaning agent comprising an effective amount of hexamethyldisilazane which is dispersed in a reducing atmosphere wherein the cleaning agent and the metal-containing contaminants are capable of reacting to form a volatile metal-ligand complex.

2. The cleaning agent of claim 1 wherein the reducing atmosphere is selected from the group consisting of hydrogen, ammonia and silane.

3. A process for cleaning metal-containing contaminants from a surface of a substrate comprising contacting the surface of the substrate with an effective amount of a cleaning agent comprising hexamethyldisilazane in the vapor phase at a temperature sufficient to form a volatile metal-ligand complex; and subliming the volatile metal-ligand complex from the surface of the substrate to provide a cleaned surface of the substrate.

4. The process of claim 3 wherein the substrate to be cleaned is selected from the group consisting of silicon, silicon oxide, borophosphosilicate glass and phosphosilicate glass.

5. The process of claim 3 wherein the contacting of the surface of the substrate with an effective amount of the cleaning agent is conducted in the presence of energy generated by an energy source capable of promoting formation of the volatile metal-ligand complex.

6. The process of claim 5 wherein the energy source is selected from the group consisting of an ion gun, RF plasma generator, microwave plasma generator, D.C. discharge generator, a deep ultraviolet generator and a tungsten filament.

7. A process for cleaning metal-containing contaminants from a surface of a substrate comprising contacting the surface of the substrate with an activating reagent under conditions sufficient to form an activated metal-containing compound; reacting the activated metal-containing compound with a cleaning agent comprising an effective amount of hexamethyldisilazane in the vapor phase at a temperature sufficient to form a volatile metal-ligand complex; and subliming the volatile metal-ligand complex from the surface of the substrate to provide a cleaned surface of the substrate.

8. The process of claim 7 wherein the substrate to be cleaned is selected from the group consisting of silicon, silicon oxide, borophosphosilicate glass and phosphosilicate glass.

9. The process of claim 7 wherein the activating reagent is an ion source capable of promoting the formation of the activated metal-containing compound.

10. The process of claim 9 wherein the ion source is generated by an ion gun.

11. The process of claim 7 wherein the activating reagent is hydrogen or ammonia which has been subjected to an energy source capable of converting the hydrogen or ammonia into an excited state.

12. The process of claim 11 wherein the hydrogen or ammonia is converted into an excited state by being subjected to energy generated by an RF plasma generator, a microwave plasma generator, a D.C. discharge generator, a deep ultraviolet generator and a tungsten filament.

13. The process of claim 12 wherein the metal-containing contaminants to be cleaned from the surface of the substrate comprise an oxide, an hydroxide or a salt of a metal.

14. A process for cleaning alkali metal-containing contaminants from a surface of a substrate comprising contacting the surface of the substrate with an activating reagent under conditions sufficient to form an activated alkali metal-containing compound; reacting the activated alkali metal-containing compound with a cleaning agent comprising an effective amount of hexamethyldisilazane in the vapor phase at a temperature sufficient to form a volatile alkali metal-ligand complex; and subliming the volatile alkali metal-ligand complex from the surface of the substrate to provide a cleaned surface of the substrate.

15. The process of claim 14 wherein the substrate to be cleaned is selected from the group consisting of silicon, silicon oxide, borophosphosilicate glass and phospho-silicate glass.

16. The process of claim 14 wherein the activating reagent is an ion source capable of promoting the formation of the activated metal-containing compound.

17. The process of claim 16 wherein the ion source is generated by an ion gun.

18. The process of claim 14 wherein the activating reagent is hydrogen or ammonia which has been subjected to an energy source capable of converting the hydrogen or ammonia into an excited state.

19. The process of claim 18 wherein the hydrogen or ammonia is converted into an excited state by being subjected to energy generated by an RF plasma generator, a microwave plasma generator, a D.C. discharge generator, a deep ultraviolet generator and a tungsten filament.

20. The process of claim 19 wherein the alkali metal-containing contaminants to be cleaned from the surface of the substrate comprise an oxide, an hydroxide or a salt of an alkali metal selected from the group consisting of lithium, sodium and potassium.

21. A cleaning agent for removing metal-containing contaminants from a surface of a substrate, the cleaning agent comprising an effective amount of hexamethyldisilazane which is dispersed in an inert atmosphere wherein the cleaning agent and the metal-containing contaminants are capable of reacting to form a volatile metal-ligand complex.

22. The cleaning agent of claim 21 wherein the inert atmosphere is selected from the group consisting of nitrogen, argon and helium.

* * * * *